United States Patent
Tsiang et al.

(10) Patent No.: US 11,060,189 B2
(45) Date of Patent: Jul. 13, 2021

(54) METHOD TO ENABLE HIGH TEMPERATURE PROCESSING WITHOUT CHAMBER DRIFTING

(71) Applicant: Applied Materials, Inc., Santa Clara, CA (US)

(72) Inventors: Michael Wenyoung Tsiang, Fremont, CA (US); Praket P. Jha, San Jose, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 45 days.

(21) Appl. No.: 16/464,892

(22) PCT Filed: Dec. 18, 2017

(86) PCT No.: PCT/US2017/067040
§ 371 (c)(1),
(2) Date: May 29, 2019

(87) PCT Pub. No.: WO2018/112463
PCT Pub. Date: Jun. 21, 2018

(65) Prior Publication Data
US 2020/0095677 A1 Mar. 26, 2020

Related U.S. Application Data
(60) Provisional application No. 62/435,525, filed on Dec. 16, 2016.

(51) Int. Cl.
*H01L 21/02* (2006.01)
*C23C 16/44* (2006.01)
(Continued)

(52) U.S. Cl.
CPC .......... *C23C 16/4405* (2013.01); *C23C 16/24* (2013.01); *C23C 16/402* (2013.01);
(Continued)

(58) Field of Classification Search
CPC ...................... H01J 37/32082; H01J 37/32862
(Continued)

(56) References Cited

U.S. PATENT DOCUMENTS

| 5,158,644 A | 10/1992 | Cheung et al. |
| 2004/0101633 A1* | 5/2004 | Zheng ............... H01L 21/02274 427/551 |

(Continued)

FOREIGN PATENT DOCUMENTS

JP 05-129285 A 5/1993

OTHER PUBLICATIONS

International Search Report and Written Opinion dated Apr. 13, 2018 for Application No. PCT/US2017/067040 dated Apr. 13, 2018.

*Primary Examiner* — Elias Ullah
(74) *Attorney, Agent, or Firm* — Patterson + Sheridan, LLP

(57) ABSTRACT

Implementations of the present disclosure provide methods for processing substrates in a processing chamber. In one implementation, the method includes (a) depositing a dielectric layer on a first substrate at a first chamber pressure using a first high-frequency RF power, (b) depositing sequentially a dielectric layer on N substrates subsequent to the first substrate at a second chamber pressure, wherein N is an integral number of 5 to 10, and wherein depositing each substrate of N substrates comprises using a second high-frequency RF power that has a power density of about 0.21 W/cm$^2$ to about 0.35 W/cm$^2$ lower than that of the first
(Continued)

high-frequency RF power, (c) performing a chamber cleaning process without the presence of a substrate, and (d) repeating (a) to (c).

20 Claims, 1 Drawing Sheet

(51) Int. Cl.
*C23C 16/24* (2006.01)
*C23C 16/40* (2006.01)
*C23C 16/505* (2006.01)
*H01J 37/32* (2006.01)

(52) U.S. Cl.
CPC ...... *C23C 16/505* (2013.01); *H01J 37/32082* (2013.01); *H01J 37/32862* (2013.01); *H01L 21/0214* (2013.01); *H01L 21/0217* (2013.01); *H01L 21/02164* (2013.01); *H01L 21/02216* (2013.01); *H01L 21/02274* (2013.01); *H01J 2237/332* (2013.01)

(58) Field of Classification Search
USPC .......................................................... 438/786
See application file for complete search history.

(56) References Cited

U.S. PATENT DOCUMENTS

| | | |
|---|---|---|
| 2015/0270107 A1 | 9/2015 | Zhao et al. |
| 2015/0348854 A1 | 12/2015 | Kapoor et al. |
| 2016/0090650 A1 | 3/2016 | Qian et al. |

\* cited by examiner

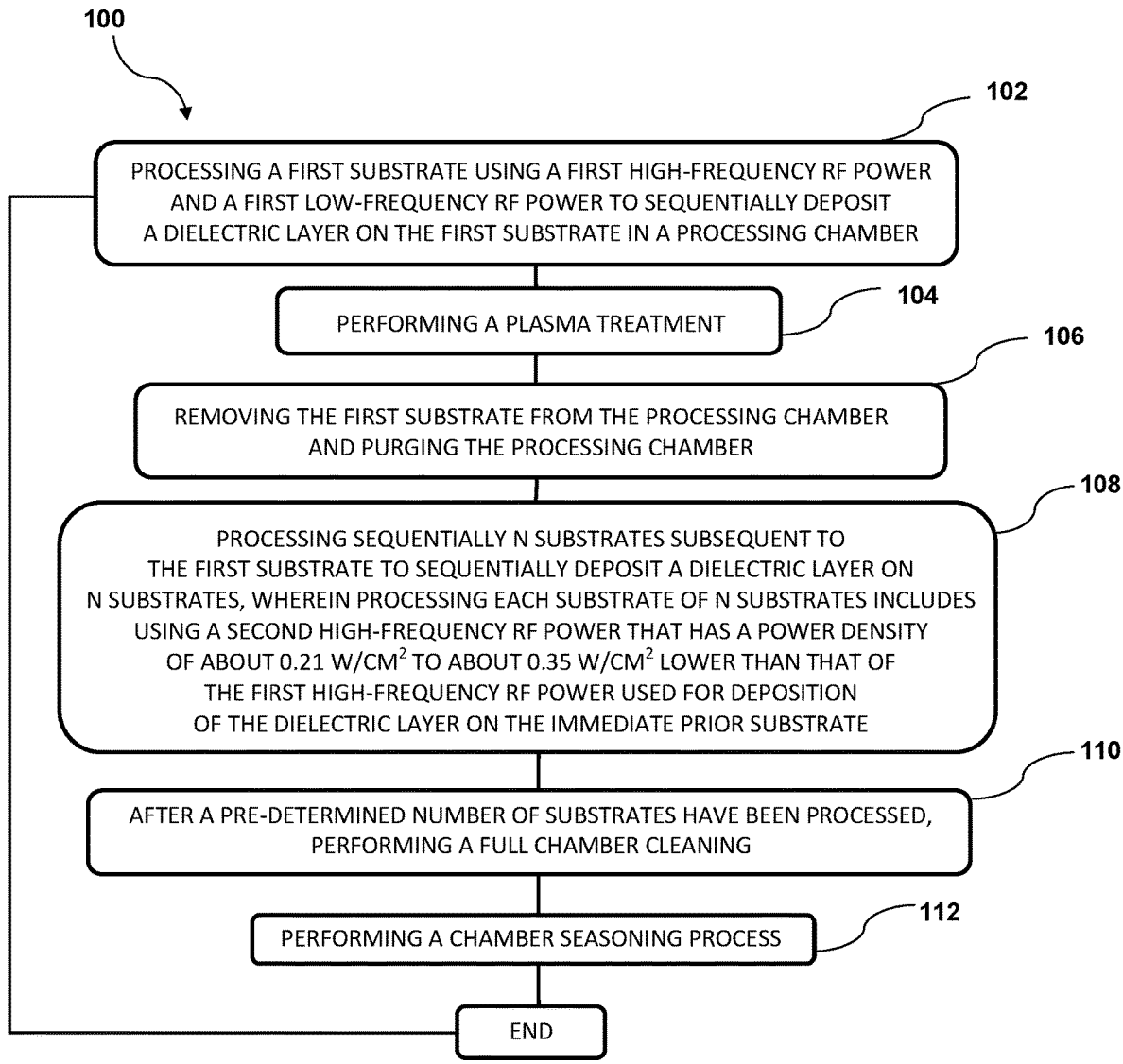

METHOD TO ENABLE HIGH TEMPERATURE PROCESSING WITHOUT CHAMBER DRIFTING

FIELD

Implementations of the present disclosure generally relate to improved methods for treating a process chamber to improve deposition uniformity.

BACKGROUND

Plasma reactors in semiconductor industry are often made of aluminum-containing materials. Particularly in a poly silicon, metal or oxide deposition chamber, an aluminum fluoride layer may form on the aluminum surfaces when fluorine containing gases such as $NF_3$ or $CF_4$ are used as the chemistry. It has been observed that formation of the aluminum fluoride has significant vapor pressure above 480 degree Celsius and starts subliming at this temperature. The aluminum fluoride is then transported to the chamber component, such as a faceplate of the process chamber. The aluminum fluoride condenses and forms a layer on the faceplate, which may flake off during a subsequent process in the chamber and contaminate the substrate surface with particles. Aluminum fluoride is difficult to remove and, after the faceplate is contaminated, there are no known methods to provide in-situ cleaning of the faceplate and/or the vacuum chamber. As a result, deposition rates within the vacuum chamber drift and the chamber becomes unstable.

Therefore, there is a need in the art to provide an improved process to clean process chamber so that deposition rate drifting and the possibility of aluminum fluoride contamination on substrate surface during processing are minimized or avoided.

SUMMARY

Implementations of the present disclosure provide methods for processing substrates in a processing chamber. In one implementation, the method includes (a) depositing a dielectric layer on a first substrate at a first chamber pressure using a first high-frequency RF power, (b) depositing sequentially a dielectric layer on N substrates subsequent to the first substrate at a second chamber pressure, wherein N is an integral number of 5 to 10, and wherein depositing each substrate of N substrates comprises using a second high-frequency RF power that has a power density of about 0.21 $W/cm^2$ to about 0.35 $W/cm^2$ lower than that of the first high-frequency RF power, (c) performing a chamber cleaning process without the presence of a substrate, and (d) repeating (a) to (c).

In another implementation, the method includes (a) processing a first substrate at a first chamber pressure using a first high-frequency RF power and a first low-frequency RF power to deposit a dielectric layer on the first substrate, (b) processing sequentially N substrates subsequent to the first substrate at a second chamber pressure to deposit a dielectric layer on N substrates, wherein N is an integral number of 5 to 10, and wherein processing each substrate of N substrates comprises using a second high-frequency RF power and a second low-frequency RF power, wherein the second high-frequency RF power has a power density that is about 0.21 $W/cm^2$ to about 0.35 $W/cm^2$ lower than that of the first high-frequency RF power used for deposition of the dielectric layer on the immediate prior substrate, (c) performing a chamber cleaning process without the presence of a substrate, and (d) repeating (a) to (c).

In yet another implementation, the method includes processing a $N^{th}$ substrate, wherein N is an integral number greater than 1, comprising using a first high-frequency RF power and a first low-frequency RF power at a first chamber pressure to deposit a first portion of a dielectric layer on the $N^{th}$ substrate, using a second high-frequency RF power and a second low-frequency RF power at a second chamber pressure to deposit a second portion of the dielectric layer on the $N^{th}$ substrate, wherein the second high-frequency RF power has a power density that is about 0.21 $W/cm^2$ to about 0.35 $W/cm^2$ lower than that of the first high-frequency RF power, and the second chamber pressure is lower than the first chamber pressure, and removing the $N^{th}$ substrate from the processing chamber. After processing the $N^{th}$ substrate, processing a $(N+1)^{th}$ substrate, comprising using the second high-frequency RF power and the second low-frequency RF power at the second chamber pressure to deposit a dielectric layer on the $(N+1)^{th}$ substrate, wherein the second high-frequency RF power has a power density that is about 0.21 $W/cm^2$ to about 0.35 $W/cm^2$ lower than that of the first high-frequency RF power used for deposition of the first portion of the dielectric layer on the $N^{th}$ substrate, and removing the $(N+1)^{th}$ substrate from the processing chamber, performing a chamber cleaning process by maintaining the temperature of the processing chamber at a first temperature of about 550° C., then cooling down the processing chamber for about 60 seconds before a cleaning gas is introduced into the processing chamber.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

FIG. 1 depicts a flow chart of an exemplary method for depositing a dielectric layer on substrates according to implementations of the present disclosure.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

FIG. 1 depicts a flow chart of a method 100 for processing substrates according to implementations of the present disclosure. The method 100 beings at block 102 by processing a first substrate in a processing chamber. The processing chamber can be any suitable substrate processing chamber using thermal and/or plasma to enhance the performance of the process, for example a chemical vapor deposition (CVD) chamber or a plasma-enhanced chemical vapor deposition (PECVD) chamber. The processing chamber may be a single processing chamber or a dual-chamber reactor having two reaction spaces which share the same or are equipped with different gas inlet and different RF systems. In one exemplary implementation, the processing chamber is a dual-chamber reactor where each RF powered processing chamber has at least a face plate, a substrate support, and a vacuum pump system. The face plate is the surface of a chamber lid that is exposed to the processing environment and faces the substrate support. One suitable process chamber that may benefit embodiments of the present disclosure is Precision® chamber, commercially available from Applied Materials, Inc., Santa Clara. Calif.

Processing of the first substrate generally includes one or more of the following procedures. First, the processing chamber is stabilized to establish a process condition that is suitable for depositing a dielectric layer on the substrate. The stabilization may include adjusting the process parameters necessary to operate the processing chamber for performing a deposition. The process parameters may include, but not limited to, setting up process conditions such as chamber pressure, electrode spacing, face plate temperature, substrate support temperature, etc. For example, the processing chamber may be stabilized by pumping and maintaining the processing chamber to a pre-determined pressure, adjusting the electrode spacing between the face plate and the substrate to a first electrode spacing, and maintaining the temperature of the substrate support at about 400° C. to about 650° C., for example about 550° C. The face plate temperature may be maintained between about 100° C. and about 300° C.

Then, a precursor gas mixture is provided to the processing chamber through the temperature controlled face plate. The gas mixture may be any suitable precursor mixture used for depositing silicon (polysilicon or amorphous silicon), silicon oxide, silicon nitride, or silicon oxynitride. Dopant precursors such as boron compounds, phosphorus compounds, and/or arsenic compounds may be included if needed. The following flow rate ranges apply for a chamber sized for 300 mm substrates. Appropriate scaling can be used for chambers sized for other substrates. Tetraethyl Orthosilicate (TEOS) may be provided at a flow rate between about 20 mgm and about 5,000 mgm. An oxygen precursor such as $N_2O$, $O_2$, $O_3$, $H_2O$, CO, or $CO_2$ can be provided at a flow rate between about 1,000 sccm and about 20,000 sccm. A silicon precursor (such as silane) may be optionally provided at a flow rate between about 20 sccm and about 2,000 sccm. A nitrogen precursor such as $N_2$, $N_2O$, $NH_3$, or $H_2N_2$, or a substituted variant thereof, or any mixture of the foregoing nitrogen species, can be provided at a flow rate between about 200 sccm and about 50,000 sccm. A carbon precursor (such as a hydrocarbon, for example methane), may be included to add carbon to the layer. Optionally, dopants precursors such as trimethylborane (TMB), diborane ($B_2H_6$), phosphine ($PH_3$), arsine ($AsH_3$), and substituted phosphines and arsines, or mixtures thereof, can be provided at flow rates between about 20 sccm and about 3,000 sccm. These precursors may be carried by a carrier gas, or diluted in a dilution gas, for example helium, argon, nitrogen, or hydrogen, or any mixture thereof, flowing at a rate of between about 500 sccm and about 30,000 sccm.

In one exemplary implementation where the dielectric layer is silicon dioxide, the precursor gas mixture includes TEOS, $N_2O$, and argon. While supplying the precursor gases into the processing chamber, the processing chamber is maintained at an initial operating pressure between about 5 Torr and about 10 Torr, for example about 8 Torr. Electrode spacing between the face plate and the substrate is established between about 200 mils and 2,000 mils. The temperature of the substrate support is maintained at about 400° C. to about 650° C., for example about 550° C.

Thereafter, a plasma is formed in the processing chamber from the precursor gas mixture to perform a deposition process. The plasma may be formed by capacitive or inductive means, and may be energized by coupling RF power into the precursor gas mixture. The RF power may be a single frequency RF power or a dual-frequency RF power having a high frequency component and a low frequency component. The RF power is typically applied at a power level between about 50 W and about 1500 W, which may be all high-frequency RF power, for example at a frequency of about 13.56 MHz, or may be a mixture of a high-frequency power of about 13.56 MHz and a low frequency power at a frequency of about 350 kHz. In one exemplary implementation, the RF power is a mixture of high-frequency power applying at a power level of about 130 W to about 200 W, for example about 170 W, and low frequency power applying at a power level of about 80 W to about 120 W, for example about 100 W. The processing chamber is maintained at the initial operating pressure of about 5 Torr and about 10 Torr, for example about 8 Torr. The temperature of the substrate support is maintained at about 400° C. to about 650° C., for example about 550° C. In some cases, the conditions may continue for a pre-determined time (e.g., about 90 seconds to about 125 seconds, for example 110 seconds) to deposit a first portion of a dielectric layer having a predetermined thickness, which is be about 1,500 Angstroms to about 10,000 Angstroms, for example about 2,500 Angstroms to about 5,000 Angstroms. While the process parameters discussed herein are to deposit a first portion of the dielectric layer, these process parameters may also be used to deposit the entire dielectric layer.

After the first portion of the dielectric layer has been deposited, the deposition process is continued by switching to use a first RF compensation recipe configured for deposition of a second portion of the dielectric layer on the first substrate. The first RF compensation recipe uses a first operating pressure that is lower than the initial operating pressure, and a mixture of a high-frequency RF power at a frequency of 13.56 MHz applied at a power level of about 180 W to about 220 W, for example about 203 W, and a low-frequency RF power at a frequency of 300 kHz applied at a power level of about 180 W to about 220 W, for example about 200 W. The first operating pressure may be at least about 3 Torr lower than the initial operating pressure. In one implementation, the first operating pressure is about 3 Torr to about 8 Torr, for example about 4.8 Torr. The temperature of the substrate support is maintained at about 400° C. to about 650° C., for example about 550° C. Flowing of the precursor gas mixture is continued to sustain the plasma in the processing chamber. If desired, any of the precursors in the precursor gas mixture may be introduced at a predetermined ramping rate to smooth the transition between depositions of first portion and second portion of the dielectric layer. The conditions are continued for a pre-determined time (e.g., about 35 seconds to about 90 seconds, for example 60 seconds) until the second portion of the dielectric layer reaches a predetermined thickness, which is about 1,000 Angstroms to about 8,000 Angstroms, for example about 1,200 Angstroms to about 3,000 Angstroms. While the first RF compensation recipe discussed herein is to deposit a second portion of the dielectric layer, these process parameters may also be used to deposit the entire dielectric layer.

At block 104, after the second portion of the dielectric layer has been deposited on the first substrate, an optional plasma treatment may be performed in situ by turning off TEOS while continuing the flow of the rest of the precursor gas mixture (e.g., $N_2O$, and argon) and the RF power. The high-frequency RF power during the plasma treatment can be controlled at a power level of about 180 W to about 220 W, for example about 203 W, and a low-frequency RF power at a power level of about 180 W to about 220 W, for example about 200 W. The plasma treatment can be performed for about 5 seconds to about 15 seconds, for example about 10 seconds.

At block 106, the first substrate is removed from the processing chamber and the processing chamber is purged using a purging gas. The purging gas may include, for example, nitrogen, argon, $N_2O$, or other inert gases suitable for purging, as well as combinations of such gases. The process conditions during purging may be identical or similar to the previous step except that no RF power is used (i.e., no plasma). In one embodiment, the purging is performed at a chamber pressure of about 20 Torr. The purging time is about 2 seconds to about 200 seconds, for example about 5 seconds to about 90 seconds. In some cases, the purging is performed at 4.8 Torr for about 5 seconds. In some cases, the purging is performed with throttle valve fully open at 1 Torr for about 20 seconds. In some cases, the purging is performed at 3 Torr for about 45 seconds. In some cases, the purging is performed at 5 Torr for about 60 seconds or above, for example about 90 seconds. If desired, the purging may be performed at higher chamber pressure (e.g., about 10 Torr to about 30 Torr) to assist removal of aluminum fluoride and other unwanted residues from the faceplate of the process chamber and exposed interior surfaces of other chamber components. In such cases, the purging can be performed at 25 Torr for about 140 seconds.

The purging gas may be flowed at a higher flow rate to prevent vaporization of aluminum fluoride from reaching the faceplate of the processing chamber. For example, the purging gas can be introduced into the plasma processing chamber at a flow rate of about 4,000 sccm to about 30,000 sccm, such as about 8,000 sccm to about 24,000 sccm, for example about 10,000 to about 20,000 sccm for a 300 mm plasma processing chamber. In one example where $N_2O$ and argon are used for the purging gas, $N_2O$ is flowed into the processing chamber at a first volumetric flowrate, and argon may be flowed into the processing chamber at a second volumetric flowrate, wherein a ratio of the first volumetric flowrate to the second volumetric flowrate may be between 0.5:1 and about 1.2:1, such as about 0.6:1 to about 1:1, for example about 0.8:1.

Thereafter, any reaction residues and/or unwanted gases are pumped out of the processing chamber through the vacuum pump system.

At block 108, N substrates subsequent to the first substrate are sequentially processed using processes identical to those described at block 102 above except that a second RF compensation recipe is used to deposit a dielectric layer on each subsequent substrate of N substrates. In one implementation, N is an integral number ranging between 5 and 10, such as between 6 and 8, for example 7. In various embodiments, the second RF compensation recipe is substantially similar to the first RF compensation recipe except that the high-frequency RF power of the second RF compensation recipe has a power density that is about 0.21 $W/cm^2$ to about 0.35 $W/cm^2$ lower than that of the high-frequency RF power used for deposition of the dielectric layer on the immediate prior substrate. The second low-frequency RF power of the second RF compensation recipe, however, can be identical or less than the first low-frequency RF power of the first RF compensation recipe.

For example, once the first substrate has been removed from the processing chamber, a second substrate is disposed in the processing chamber for deposition of a dielectric layer thereon. The second substrate is subjected to processes identical to those described at block 102 above except that the deposition process uses the second RF compensation recipe to deposit a dielectric layer on the second substrate. In this case, the dielectric layer is deposited using a high-frequency RF power that is about 1.5 W to about 3 W less than the high-frequency RF power of the first RF compensation recipe.

In one exemplary implementation, the high-frequency RF power used to deposit the second portion of the dielectric layer on the second substrate is applied at a power level of about 201.5 W. Once the second substrate is done with the deposition, the second substrate is removed from the processing chamber and a third substrate is disposed in the processing chamber for deposition of a dielectric layer thereon. The third substrate is subjected to processes identical to those described at block 102 above except that the deposition process uses the second RF compensation recipe to deposit a dielectric layer on the third substrate. In this case, the dielectric layer is deposited using a high-frequency RF power that is about 1.5 W to about 3 W less than the high-frequency RF power of the second RF compensation recipe used for the second substrate. In one exemplary implementation, the high-frequency RF power used to deposit the dielectric layer on the third substrate is applied at a power level of about 200.0 W. This second RF compensation recipe may continue to apply to fourth, fifth, sixth . . . substrates of a batch of substrates until a full chamber cleaning process (to be discussed below) becomes necessary. The full chamber cleaning process may be performed every 5 substrates to 20 substrates, for example about 7 substrates to about 12 substrates, which may vary depending upon the application.

At block 110, once a pre-determined number of substrates have been processed, a full chamber cleaning process is performed to remove any unwanted material(s) left on the chamber walls or surfaces of the chamber components. The pre-defined number may be between 5 and 15, for example 7 to 10. Alternatively, the full chamber cleaning process may be performed at any pre-determined interval, depending on the chamber conditions and/or the number of substrates processed in the processing chamber. The full chamber cleaning process may be performed before, during, and/or after the deposition process, and is conducted without the presence of the substrate in the processing chamber.

The full chamber cleaning process may include an in-situ dry cleaning process or a remote plasma source cleaning. In an in-situ dry cleaning process, one or more gases are dissociated within the processing chamber to form one or more reactive gas species (e.g., fluorine ions, radicals, etc). The reactive species are effective in scavenging aluminum fluoride residues present in the processing chamber. In a remote plasma source cleaning, as used in this implementation, cleaning gas(es) are dissociated in a separate chamber (e.g., an RPS chamber) to form one or more reactive species which are then flowed downstream into the processing chamber to assist in chamber cleaning.

The cleaning gas includes fluorine ($F_2$ and/or F) and/or fluorine radicals (F*). As a source of these species, the cleaning gas may include a perfluorinated or hydrofluorocarbon compound, for example $NF_3$, $CF_4$, $C_2F_6$, $CHF_3$, $C_3F_8$, $C_4F_8$, $SF_6$, or the combination thereof. Optionally, the cleaning gas may further include inert gas, such as helium or argon to help initiate the plasma. In cases where an $NF_3$ precursor gas is used, the cleaning process can be performed by introducing $NF_3$ precursor into the processing chamber at a flow rate between about 200 sccm and about 20,000 sccm and at a chamber pressure of about 1 Torr to about 20 Torr, for example about 4 Torr to about 10 Torr. The power applied to the RPS chamber to activate the $NF_3$ precursor gas is between about 1000 W and about 10,000 W. The electrode spacing is kept at about 200 mils to about 900 mils. The temperature of the processing chamber during full chamber cleaning process is maintained at 400° C. to about 550° C., for example about 470° C. to about 520° C. The duration of the cleaning process is about 60 seconds to about 240 seconds, for example 90 seconds to about 180 seconds. The above ranges apply for a chamber sized for 300 mm substrates. Appropriate scaling may be used for chambers sized for other substrates.

In some embodiments, the full chamber cleaning process may be a two-stage cleaning. In such a case, the cleaning gas such as $NF_3$ precursor and other gases such as argon are introduced into the processing chamber to perform a first cleaning. The first clean can be performed using the parameters mentioned above except that the electrode spacing is kept at a first spacing of about 200 mils to about 800 mils, for example about 600 mils. The first clean can be performed for about 10 seconds before a second cleaning is performed. The second cleaning can be performed for about 20 seconds under the parameters similar to the first clean except that the electrode spacing is kept at a second spacing that is greater than the first spacing, for example about 900 mils to about 1200 mils. The second cleaning performing at wider electrode spacing can be beneficial because it reduces AlF build up on the faceplate. A chamber purging using argon (and optionally nitrogen) may then be performed for about 20 seconds before the cleaning gas is introduced into the processing chamber.

In some embodiments, the full chamber cleaning process is a cool cleaning by maintaining the chamber temperature at about 550° C., then the processing chamber is cool down for about 60 seconds before the cleaning gas is introduced into the processing chamber to start the above-mentioned cleaning. Therefore, the full chamber cleaning process is performed while the processing chamber is cooling down. The processing chamber is then cooled down to a temperature of about 520° C. or below, such as about 500° C. or below, for example about 480° C. After the full chamber cleaning process, the chamber temperature starts to heat up again back to about 550° C. for preparation of the subsequent processes.

In cases where a chamber seasoning process (to be discussed below in more detail) was performed prior to the purging, the purging gas and/or purging time may change. For example, the purging gas used during a purging stage before the chamber seasoning process may include argon and nitrogen gas and the purging gas used during a purging stage after the chamber seasoning process may include argon only. In such a case, the purging time during the purging stage before the chamber seasoning process is about 15 seconds to about 30 seconds, for example about 20 seconds, while the purging time during the purging stage after the chamber seasoning process is about 3 seconds to about 10 seconds, for example about 5 seconds.

At block 112, a chamber seasoning process is performed by introducing TEOS, oxygen, and helium or argon into the processing chamber. A plasma is formed from the introduced gases to form an oxide (e.g., silicon dioxide) seasoning layer onto exposed interior surfaces of the chamber components, such as the faceplate and/or chamber walls. The seasoning layer serves as a capping layer which prevents aluminum fluoride from sublimating and reaching the face plate and/or exposed interior surfaces of other chamber components such as chamber walls. It is contemplated that instead of silicon dioxide, any precursor gas that is chemically reactive with deposition residue (e.g., fluorine) and/or deposits by CVD or PECVD can also be used. Any embodiments of the full chamber cleaning process discussed herein may be repeated as many times as necessary until a pre-determined chamber condition is achieved.

In one implementation, the chamber seasoning process is performed by introducing TEOS into the processing chamber at a rate of 800 mgm to about 2,000 mgm, for example about 1,200 mgm, and combining it with helium or argon carrier gas introduced at about 50 sccm to about 3,600 sccm. In some cases, silane is used in place of TEOS. Oxygen, such as $N_2O$, is introduced into the processing chamber at 8,000 sccm to about 20,000 sccm, for example about 11,000 sccm. A plasma is formed by application of mixed frequency RF power having a high-frequency component (13.56 MHz) applied at 590 W, and a low-frequency component (350 KHz) applied at 220 W. The temperature of the processing chamber during chamber seasoning process is kept at 400° C. to about 550° C., for example about 470° C. The face plate temperature is maintained between about 100° C. and about 300° C., for example 200° C. The chamber pressure is maintained at about 1 Torr to about 20 Torr, for example about 4.5 Torr to about 10 Torr. The chamber seasoning layer has a thickness varying from about 1,500 Angstrom to about 20,000 Angstrom, such as about 2,000 Angstrom to about 15,000 Angstrom, for example about 10,000 Angstrom, depending upon the number of the substrates processed. In some examples where 7 substrates are processed before the chamber seasoning process, the seasoning layer may have a thickness of about 10,000 Angstrom. While silicon dioxide is discussed, it is contemplated that the chamber seasoning layer may include an amorphous silicon layer which may be deposited by reacting a hydrogen-containing gas with a silicon-containing gas in the processing chamber.

After completion of block 112, the method 100 may proceed to an end, or any of blocks 102 to 112 can be repeated until a predefined number or all substrates in a batch are processed.

Benefits of the present disclosure include an improved cleaning approach and deposition process using RF compensation to enable consistent film uniformity of multiple substrates. By gradually decreasing high-frequency RF power during deposition of a dielectric layer on a batch of substrates, film property drifts and clean frequency can be minimized. For example, the film property drifting (due to face plate emissivity change from AlF build up) in the processing chamber can be avoided. Eliminating uncontrolled ramping of gases, pressure and RF power, and eliminating unnecessary divert to chamber switching, process stability can be improved. An improved cleaning process can be performed before, during, and/or after a pre-determined number of substrates are done with the deposition to help remove aluminum fluoride and other unwanted residues from the face plate or other chamber components of the processing chamber. As a result, the life time of the face plate and/or chamber components are elongated.

While the foregoing is directed to implementations of the present disclosure, other and further implementations of the disclosure may be devised without departing from the basic scope thereof.

The invention claimed is:

1. A method for processing substrates in a processing chamber, comprising:
   (a) depositing a dielectric layer on a first substrate in the processing chamber at a first chamber pressure using a first RF power;
   (b) removing the first substrate from the processing chamber;
   (c) subsequent to removing the first substrate, depositing sequentially a dielectric layer on N substrates subsequent to the first substrate at a second chamber pressure, wherein N is an integral number of 5 to 10, and wherein depositing each substrate of N substrates comprises using a second RF power that has a power density that is about 0.21 W/cm$^2$ to about 0.35 W/cm$^2$ lower than that of the first RF power;
   (d) performing a chamber cleaning process without a presence of a substrate; and
   (e) repeating (a) through (d).

2. The method of claim 1, wherein the second chamber pressure is lower than the first chamber pressure.

3. The method of claim 1, wherein the chamber cleaning process uses a cleaning gas comprising fluorine and/or fluorine radicals (F*).

4. The method of claim 3, further comprising:
   after (d), depositing a seasoning layer over a surface of a chamber component disposed in a processing region of the processing chamber, wherein the seasoning layer has a thickness of about 8,000 Angstrom to about 20,000 Angstrom.

5. The method of claim 4, wherein the seasoning layer is silicon dioxide or amorphous silicon.

6. The method of claim 1, wherein a temperature of a substrate support is maintained at about 400° C. to about 650° C. during (a) and (c).

7. The method of claim 1, wherein the processing chamber is maintained at a temperature of about 400° C. to about 550° C. during (d).

8. A method for processing substrates in a processing chamber, comprising:
   (a) depositing a dielectric layer on a first substrate in the processing chamber at a first chamber pressure using a first RF power;
   (b) depositing sequentially a dielectric layer on N substrates subsequent to the first substrate at a second chamber pressure, wherein N is an integral number of 5 to 10, and wherein depositing each substrate of N substrates comprises using a second RF power that has a power density that is about 0.21 W/cm$^2$ to about 0.35 W/cm$^2$ lower than that of the first RF power;
   (c) performing a chamber cleaning process without a presence of a substrate, wherein the chamber cleaning process includes a first clean stage performed at a first electrode spacing of about 200 mils to about 800 mils, and a second clean stage performed at a second electrode spacing of about 900 mils to about 1200 mils; and
   (d) repeating (a) through (c).

9. A method for processing substrates in a processing chamber, comprising:
   (a) processing a first substrate in the processing chamber at a first chamber pressure using a first high-frequency RF power and a first low-frequency RF power to deposit a dielectric layer on the first substrate;
   (b) removing the first substrate from the processing chamber;
   (c) subsequent to removing the first substrate, processing sequentially N substrates subsequent to the first substrate at a second chamber pressure to deposit a dielectric layer on N substrates, wherein N is an integral number of 5 to 10, and wherein processing each substrate of N substrates comprises using a second high-frequency RF power and a second low-frequency RF power, wherein the second high-frequency RF power has a power density that is about 0.21 W/cm$^2$ to about 0.35 W/cm$^2$ lower than that of the first high-frequency RF power used for deposition of the dielectric layer on an immediate prior substrate;
   (d) performing a chamber cleaning process without a presence of a substrate; and
   (e) repeating (a) to (d) until all substrates from a batch is processed.

10. The method of claim 9, wherein the second low-frequency RF power is identical to the first low-frequency RF power.

11. The method of claim 9, wherein the second chamber pressure is lower than the first chamber pressure.

12. The method of claim 9, wherein the dielectric layer is deposited using a plasma formed from silicon, silicon oxide, silicon nitride, or silicon oxynitride precursor mixture.

13. The method of claim 9, wherein a temperature of a substrate support is maintained at about 400° C. to about 650° C. during (a) and (b).

14. The method of claim 9, wherein the processing chamber is maintained at a temperature of about 400° C. to about 550° C. during (c).

15. A method for processing substrates in a processing chamber, comprising:
   (a) processing a first substrate in the processing chamber at a first chamber pressure using a first high-frequency RF power and a first low-frequency RF power to deposit a dielectric layer on the first substrate;
   (b) processing sequentially N substrates subsequent to the first substrate at a second chamber pressure to deposit a dielectric layer on N substrates, wherein N is an integral number of 5 to 10, and wherein processing each substrate of N substrates comprises using a second high-frequency RF power and a second low-frequency RF power, wherein the second high-frequency RF power has a power density that is about 0.21 W/cm$^2$ to about 0.35 W/cm$^2$ lower than that of the first high-frequency RF power used for deposition of the dielectric layer on an immediate prior substrate;
   (c) performing a chamber cleaning process without a presence of a substrate, wherein the chamber cleaning process includes a first clean stage performed for a duration of about 10 seconds and at a first electrode spacing of about 200 mils to about 800 mils, and a second clean stage performed for a duration of about 20 seconds and at a second electrode spacing of about 900 mils to about 1200 mils; and
   (d) repeating (a) to (c) until all substrates from a batch is processed.

16. The method of claim 15, further comprising:
   after the chamber cleaning process, depositing a seasoning layer over a surface of a chamber component disposed in a processing region of the processing chamber, wherein the seasoning layer has a thickness of about 8,000 Angstrom to about 20,000 Angstrom.

17. The method of claim 16, wherein the seasoning layer is silicon dioxide or amorphous silicon.

18. A method for processing substrates in a processing chamber, comprising:
   processing a $N^{th}$ substrate, wherein N is an integral number greater than 1, comprising:

using a first high-frequency RF power and a first low-frequency RF power at a first chamber pressure to deposit a first portion of a dielectric layer on the $N^{th}$ substrate;

using a second high-frequency RF power and a second low-frequency RF power at a second chamber pressure to deposit a second portion of the dielectric layer on the $N^{th}$ substrate, wherein the second high-frequency RF power has a power density that is about 0.21 W/cm$^2$ to about 0.35 W/cm$^2$ lower than that of the first high-frequency RF power, and the second chamber pressure is lower than the first chamber pressure; and removing the $N^{th}$ substrate from the processing chamber;

processing a $(N+1)^{th}$ substrate, comprising:

using the second high-frequency RF power and the second low-frequency RF power at the second chamber pressure to deposit a dielectric layer on the $(N+1)^{th}$ substrate, wherein the second high-frequency RF power has a power density that is about 0.21 W/cm$^2$ to about 0.35 W/cm$^2$ lower than that of the first high-frequency RF power used for deposition of the first portion of the dielectric layer on the $N^{th}$ substrate; and removing the $(N+1)^{th}$ substrate from the processing chamber; and performing a chamber cleaning process by maintaining a temperature of the processing chamber at a first temperature of about 550° C., then cooling down the processing chamber for about 60 seconds before a cleaning gas is introduced into the processing chamber.

19. The method of claim 18, wherein the cleaning gas comprises fluorine and/or fluorine radicals (F*).

20. The method of claim 19, further comprising:

after performing the chamber cleaning process, depositing a seasoning layer over a surface of a chamber component disposed in a processing region of the processing chamber, wherein the seasoning layer has a thickness of about 8,000 Angstrom to about 20,000 Angstrom.

* * * * *